US010644661B2

(12) United States Patent
Das et al.

(10) Patent No.: US 10,644,661 B2
(45) Date of Patent: May 5, 2020

(54) VARIABLE OUTPUT RESISTANCE IN A PLAYBACK PATH WITH OPEN-LOOP PULSE-WIDTH MODULATION DRIVER

(71) Applicant: Cirrus Logic International Semiconductor Ltd., Edinburgh (GB)

(72) Inventors: Tejasvi Das, Austin, TX (US); Eric J. King, Austin, TX (US); Xin Zhao, Austin, TX (US); Xiaofan Fei, Austin, TX (US); Johann G. Gaboriau, Austin, TX (US); Lei Zhu, Austin, TX (US); John L. Melanson, Austin, TX (US); Thomas Hoff, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/190,427

(22) Filed: Nov. 14, 2018

(65) Prior Publication Data

US 2020/0044616 A1    Feb. 6, 2020

Related U.S. Application Data

(60) Provisional application No. 62/714,809, filed on Aug. 6, 2018.

(51) Int. Cl.
*H03F 3/393*    (2006.01)
*H03F 3/217*    (2006.01)
(Continued)

(52) U.S. Cl.
CPC ............. *H03F 3/393* (2013.01); *H03F 3/187* (2013.01); *H03F 3/2171* (2013.01);
(Continued)

(58) Field of Classification Search
CPC ........................................................ H03F 3/393
(Continued)

(56) References Cited

U.S. PATENT DOCUMENTS 5,636,284 A * 6/1997 Pritchard ................. G10H 1/16
                                                         381/61
6,438,360 B1 * 8/2002 Alberth, Jr. ........... H03F 1/0222
                                                         330/129
(Continued)

OTHER PUBLICATIONS

International Search Report and Written Opinion of the International Searching Authority, International Application No. PCT/US2019/045091.

*Primary Examiner* — Patricia T Nguyen
(74) *Attorney, Agent, or Firm* — Jackson Walker L.L.P.

(57) ABSTRACT

In a signal path comprising an analog path portion configured to operate in a plurality of output impedance modes including a high impedance mode with a first impedance and a low impedance mode with a second impedance, and a digital path portion having a variable digital gain and configured to convert a digital input signal and into an analog signal provided to the analog path portion, a method may include responsive to a condition for switching between the high impedance mode and the low impedance mode or vice versa, transitioning the output impedance continuously or in a series of steps between the first impedance and the second impedance or vice versa and, contemporaneously with transitioning the output impedance, transitioning the variable digital gain continuously or in a series of steps such to maintain a substantially constant overall path gain for the signal path remains substantially constant during transition.

22 Claims, 4 Drawing Sheets

(51) Int. Cl.
*H03F 3/187* (2006.01)
*H03G 3/30* (2006.01)

(52) U.S. Cl.
CPC ......... *H03G 3/301* (2013.01); *H03F 2200/03* (2013.01); *H03F 2200/351* (2013.01); *H03F 2200/381* (2013.01); *H03F 2200/387* (2013.01)

(58) Field of Classification Search
USPC .......................................................... 330/10
See application file for complete search history.

(56) References Cited

U.S. PATENT DOCUMENTS

| | | | | |
|---|---|---|---|---|
| 7,102,429 | B2* | 9/2006 | Stengel | H03F 1/0266 |
| | | | | 330/10 |
| 7,915,923 | B1* | 3/2011 | Yeung | H04L 25/0264 |
| | | | | 326/82 |
| 9,860,640 | B2* | 1/2018 | Bogdanov | H03F 3/181 |
| 2013/0070930 | A1* | 3/2013 | Johnson | H04R 3/007 |
| | | | | 381/57 |
| 2014/0266433 | A1 | 9/2014 | Nobbe et al. | |
| 2015/0091649 | A1 | 4/2015 | Jeon et al. | |
| 2015/0236877 | A1* | 8/2015 | Peng | H04L 25/08 |
| | | | | 375/297 |
| 2016/0329867 | A1* | 11/2016 | Lesso | H03F 1/3241 |
| 2018/0212570 | A1 | 7/2018 | Zhu et al. | |

\* cited by examiner

VARIABLE OUTPUT RESISTANCE IN A PLAYBACK PATH WITH OPEN-LOOP PULSE-WIDTH MODULATION DRIVER

RELATED APPLICATION

The present disclosure claims priority to U.S. Provisional Patent Application Ser. No. 62/714,809, filed Aug. 6, 2018, which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

SUMMARY

In accordance with the teachings of the present disclosure, one or more disadvantages and problems associated with existing approaches to processing signals with an amplifier may be reduced or eliminated.

In accordance with embodiments of the present disclosure, an apparatus may include a signal path and a control circuit. The signal path may include an analog signal path portion having an input for receiving an analog signal and an output for providing an output signal, and configured to generate the output signal, wherein the analog signal path portion is configured to operate in a plurality of output impedance modes including a high impedance mode in which an output impedance of the analog signal path portion at the output has a first impedance and a low impedance mode in which the output impedance has a second impedance significantly smaller than the first impedance and a digital path portion having a variable digital gain and configured to receive a digital input signal and convert the digital input signal into the analog signal in conformity with the variable digital gain. The control circuit may be configured to, responsive to a condition for switching between the high impedance mode and the low impedance mode or vice versa, transition the output impedance continuously or in a series of steps between the first impedance and the second impedance or vice versa, and contemporaneously with transitioning the output impedance, transition the variable digital gain continuously or in a series of steps such that an overall path gain of the signal path remains substantially constant during the transitioning of the output impedance.

In accordance with these and other embodiments of the present disclosure, a method may be provided for use in a signal path comprising an analog signal path portion having an input for receiving an analog signal and an output for providing an output signal, and configured to generate the output signal, wherein the analog signal path portion is configured to operate in a plurality of output impedance modes including a high impedance mode in which an output impedance of the analog signal path portion at the output has a first impedance and a low impedance mode in which the output impedance has a second impedance significantly smaller than the first impedance and a digital path portion having a variable digital gain and configured to receive a digital input signal and convert the digital input signal into the analog signal in conformity with the variable digital gain. The method may comprise, responsive to a condition for switching between the high impedance mode and the low impedance mode or vice versa, transitioning the output impedance continuously or in a series of steps between the first impedance and the second impedance or vice versa, and contemporaneously with transitioning the output impedance, transitioning the variable digital gain continuously or in a series of steps such that an overall path gain of the signal path remains substantially constant during the transitioning of the output impedance.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
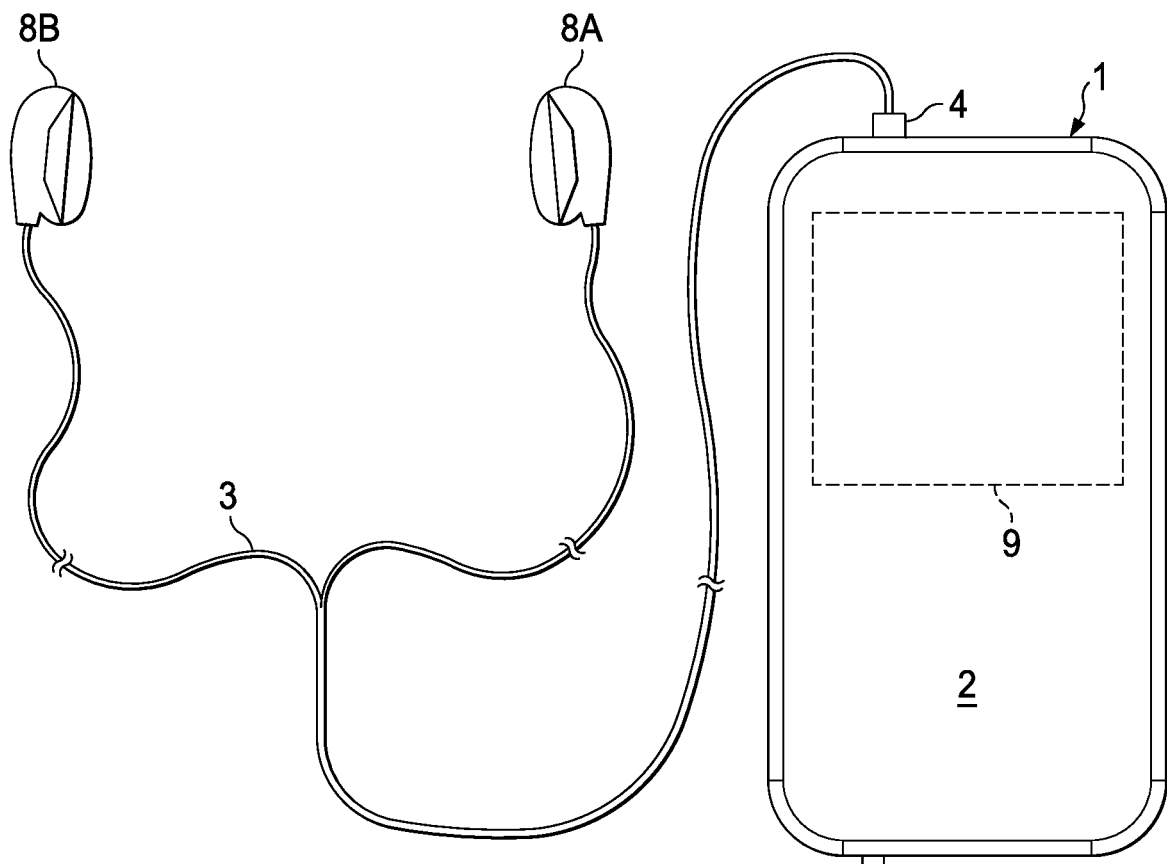
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Alternatively, in some embodiments, headset 3 may be wirelessly coupled (such as, for example, through a Bluetooth® connection) to personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
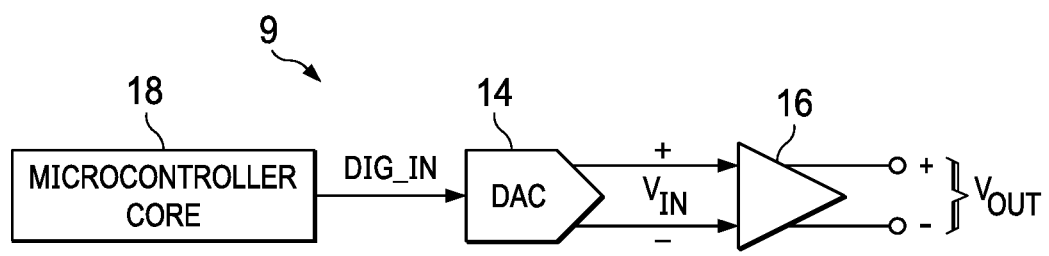
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
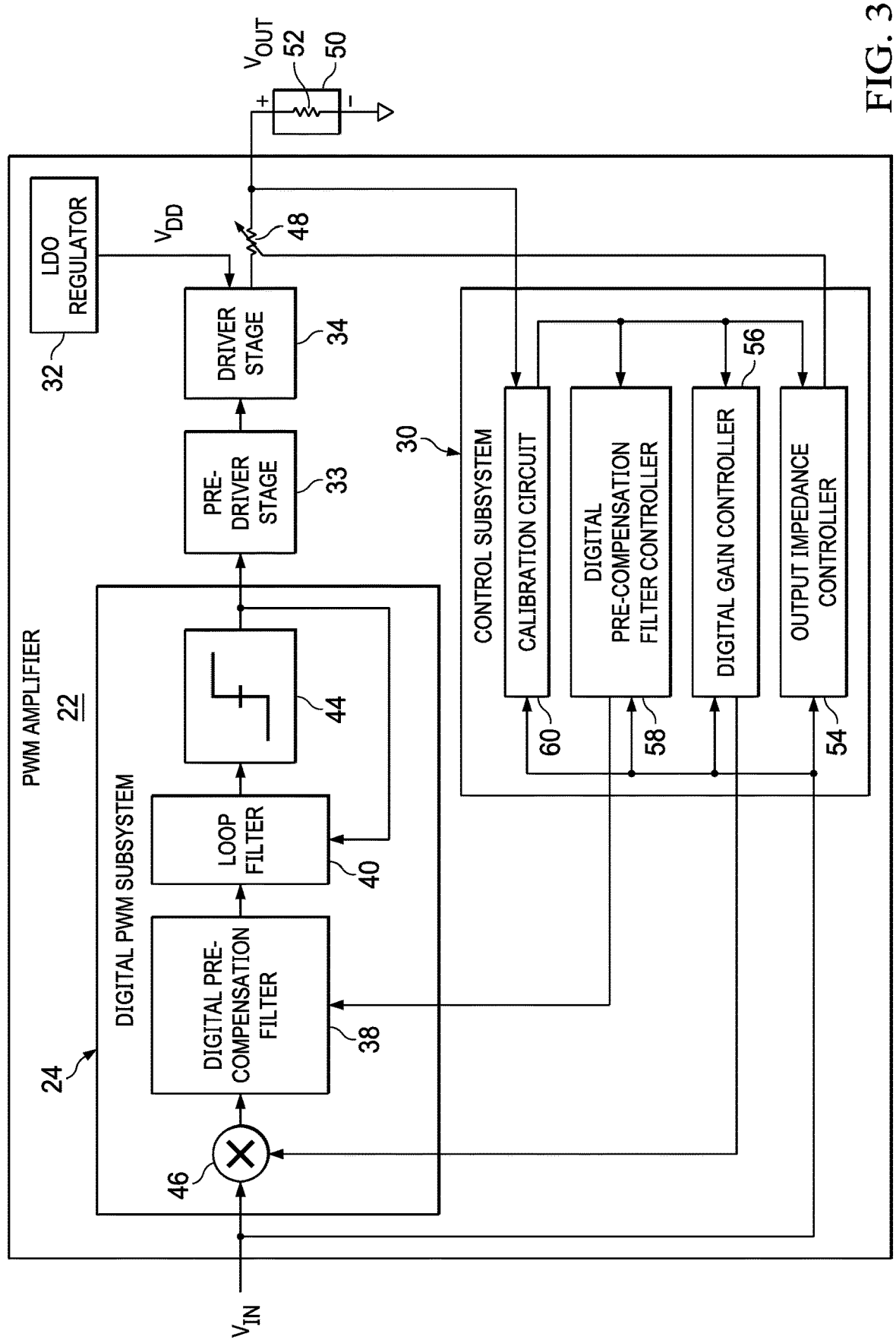
FIG. 3 is a block diagram of selected components of an example pulse width modulation amplifier, in accordance with embodiments of the present disclosure.

FIG. 3 is a block diagram of selected components of an example pulse width modulation (PWM) amplifier 22, in accordance with embodiments of the present disclosure. In some embodiments, example pulse width modulation amplifier 22 may be used to implement all or a portion of amplifier 16 of FIG. 2. As shown in FIG. 3, example pulse width modulation amplifier 22 may include a digital PWM subsystem 24, a pre-driver stage 33, a driver stage 34 powered from a low-dropout (LDO) regulator 32 and configured to drive a load 50 coupled to the output of PWM amplifier 22, a variable output impedance 48, and a control subsystem 30.

As shown, PWM amplifier 22 may operate as a digital open-loop class-D amplifier, utilizing the signal path formed by digital PWM subsystem 24, pre-driver stage 33, and driver stage 34. Digital PWM subsystem 24 may comprise any suitable system, device, or apparatus for converting input signal $V_{IN}$ into an equivalent PWM signal. As shown in FIG. 3, digital PWM subsystem 24 may comprise a feedforward path including a digital gain element 46, a digital pre-compensation filter 38, a loop filter 40, a quantizer 44, and a feedback path from the output of quantizer 44 to the input of loop filter 40.

Digital gain element 46 may comprise any system, device, or apparatus configured to have a variable digital gain and apply such variable digital gain to the digital PWM signal output by quantizer 44 to generate a feedback signal to loop filter 40. As shown in FIG. 3 and described in greater detail below, the variable digital gain of digital gain element 46 may be controlled by one or more control signals generated by control subsystem 30.

Digital pre-compensation filter 38 may comprise any system, device, or apparatus configured to apply a variable frequency response to a digital signal received at its input to generate a filtered digital signal at its output. As shown in FIG. 3 and described in greater detail below, the variable frequency response of digital pre-compensation filter 38 may be controlled by one or more control signals generated by control subsystem 30 in order to control the variable frequency response of digital pre-compensation filter 38 in order to compensate for phase variations caused by modifying variable output impedance 48.

Loop filter 40 may comprise any system, device, or apparatus configured to receive an input signal (e.g., input signal $V_{IN}$ as modified by gain element 46 and filtered by digital pre-compensation filter 38) and a feedback signal (e.g., output of quantizer 44) and based on such input signal and feedback signal, generate a filtered input signal to be communicated to quantizer 44. In some embodiments, such filtered input signal may comprise a signal indicative of an integrated error between the input signal to loop filter 40 and the feedback signal.

Quantizer 44 may comprise any system, device, or apparatus configured to quantize a signal (e.g., the filtered input signal) to generate an equivalent digital PWM signal.

Pre-driver stage 33 may comprise any system, device, or apparatus configured to receive a quantized PWM signal (e.g., as generated by digital PWM subsystem 24) and condition such signal for driver stage 34. Accordingly, pre-driver stage 33 may comprise a signal buffer and/or other logic elements to provide control of gate terminals of switches of driver stage 34.

Driver stage 34 may comprise any system, device, or apparatus configured to receive a quantized PWM signal (e.g., as generated by digital PWM subsystem 24 and conditioned by pre-driver stage 33) and drive an output signal to load 50 (which load 50 may have a load impedance 52), which load 50 may include a transducer (e.g., an audio transducer, haptic transducer, or other transducer). Accordingly, driver stage 34 may comprise a plurality of output switches configured to generate output signal $V_{OUT}$ from a modulated signal generated by digital PWM subsystem 24.

As shown in FIG. 3, LDO regulator 32 may supply electrical energy via supply voltage $V_{DD}$ to driver stage 34, such that driver stage 34 may use such electrical energy to generate output signal $V_{OUT}$. As known in the art, an LDO regulator may comprise a direct-current linear voltage regulator that may regulate its output voltage even when an input voltage of the LDO regulator is very close to its output voltage.

Output impedance 48 may comprise any system, device, or apparatus configured to have a variable impedance wherein the variable impedance is controlled by one or more control signals generated by control subsystem 30, as described in greater detail below.

Control subsystem 30 may include any system, device, or apparatus configured to receive an input signal (e.g., input signal $V_{IN}$) and based on one or more characteristics of the input signal, control one or more of variable output impedance 48, the variable digital gain of digital gain element 46, and the frequency response of digital pre-compensation filter 38. Such one or more characteristics of the input signal comprise one or more of a magnitude of the input signal, a signal frequency of the input signal, and a signal ramp rate (e.g., a rate of increase or decrease of the magnitude) of the input signal.

For example, control subsystem 30 may include an output impedance controller 54 configured to receive an input signal (e.g., input signal $V_{IN}$) and based on one or more characteristics of the input signal, control the impedance of variable output impedance 48. In some embodiments, output impedance controller 54 together with variable output impedance 48 may operate in a plurality of output impedance modes including a high impedance mode in which variable output impedance 48 has a first impedance and a low impedance mode in which variable output impedance 48 has a second impedance significantly smaller than the first impedance. In such embodiments, output impedance controller 54 together with variable output impedance 48 may operate in the high impedance mode when the input signal is below a threshold magnitude and may operate in the low impedance mode when the input signal is above the threshold magnitude. In order to reduce audio artifacts (e.g., audible pops and clicks) associated in changing between the high impedance mode and the low impedance mode (or vice versa), output impedance controller 54 may transition the output impedance continuously or in a series of steps between the first impedance and the second impedance (or vice versa). As will be recognized by those of skill in the art, varying of the impedance of variable output impedance 48 has the effect of varying an analog gain of an analog path portion (e.g., comprising pre-driver stage 33 and driver stage 34) of the signal path of PWM amplifier 22.

As another example, control subsystem 30 may include a digital gain controller 56 configured to receive an input signal (e.g., input signal $V_{IN}$) and based on one or more characteristics of the input signal, control the variable digital gain of digital gain element 46. In embodiments described above in which output impedance controller 54 together with variable output impedance 48 may operate in a plurality of output impedance modes including the high impedance mode and the low impedance mode, contemporaneously with transitioning the output impedance between the high impedance mode and low impedance mode (or vice versa), digital gain controller 56 may transition the variable digital gain of digital gain element 46 continuously or in a series of steps such that an overall path gain of the signal path of PWM amplifier 22 remains substantially constant during the transitioning of variable output impedance 48 between the high impedance mode and low impedance mode (or vice versa).

As a further example, control subsystem 30 may include a digital pre-compensation filter controller 58 configured to receive an input signal (e.g., input signal $V_{IN}$) and based on one or more characteristics of the input signal, control the variable frequency response of digital pre-compensation filter 38. Such control of the frequency response of digital pre-compensation filter 38 may compensate for phase variations of the signal path of PWM amplifier 22 caused by varying the impedance of variable output impedance 48.

As shown in FIG. 3, control subsystem 30 may also include a calibration circuit 60. Calibration circuit 60 may include any system, device, or apparatus configured to receive an input signal (e.g., input signal $V_{IN}$) and an output signal (e.g., output signal $V_{OUT}$) and based on characteristics of the input signal and output signal calibrate the variable digital gain of digital gain element 46 and the impedance of variable output impedance 48 (which, as stated above, controls an analog gain of the signal path of PWM amplifier 22), in order to set an overall path gain of the signal path of PWM amplifier 22 to a desired gain (e.g., in some embodiments, a unity gain). In some embodiments, calibration circuit 60 may be present on the same integrated circuit as the signal path of PWM amplifier 22, such that calibration circuit 60 may experience the same conditions (e.g., external conditions such as temperature, pressure, etc.) as the signal path. In some embodiments, calibration circuit 60 may perform such calibration at product test of PWM amplifier 22 prior to end use of PWM amplifier 22 (e.g., by using a pilot tone for the input signal and comparing it with the output signal generated from the pilot tone). In these and other embodiments, calibration circuit 60 may perform such calibration during real-time operation of PWM amplifier 22 during its end use (e.g., use in an audio system, haptic system, or other system), such that calibration circuit 60 implements a calibration loop. When calibration is performed in real-time operation of PWM amplifier 22, such calibration may compensate for variation in variable output resistance 48 due to changes in temperature.

In these and other embodiments, calibration circuit 60 may be configured to calibrate a frequency response of the signal path of PWM amplifier 22 by monitoring the frequency response during product test of PWM amplifier 22 prior to end use of the apparatus and modifying the variable frequency response of digital pre-compensation filter 38 in order to set the overall frequency response of the signal path of PWM amplifier 22 to a desired response. In these and other embodiments, calibration circuit 60 may perform such frequency response calibration during real-time operation of PWM amplifier 22 during end use, such that calibration circuit 60 implements a calibration loop.

The foregoing thus described example embodiments of an apparatus (e.g., PWM amplifier 22, audio IC 9, personal audio device 1), comprising a signal path (e.g., the path of PWM amplifier 22 from input signal $V_{IN}$ to output signal $V_{OUT}$) and a control circuit (e.g., control subsystem 30). The signal path may include an analog signal path portion (e.g., pre-driver stage 33 and driver stage 34) having an input (e.g., input signal to pre-driver stage 33) for receiving an analog signal and an output (e.g., output of driver stage 34) for providing an output signal (e.g., output signal $V_{OUT}$), and configured to generate the output signal, wherein the analog signal path portion is configured to operate in a plurality of output impedance modes including a high impedance mode in which an output impedance of the analog signal path portion at the output has a first impedance and a low impedance mode in which the output impedance has a second impedance significantly smaller than the first impedance (e.g., by varying variable output impedance 48). The signal path may also include a digital path portion (e.g., digital PWM subsystem 24) having a variable digital gain (e.g., digital gain element 46) and configured to receive a digital input signal (e.g., input signal $V_{IN}$) and convert the digital input signal into the analog signal (e.g., input signal to pre-driver stage 33) in conformity with the variable digital gain. The control circuit may be configured to, responsive to a condition for switching between the high impedance mode and the low impedance mode or vice versa (e.g., input signal $V_{IN}$ rising above or falling below a threshold magnitude and/or the occurrence of one or more other characteristics of input signal $V_{IN}$), transition the output impedance continuously or in a series of steps between the first impedance and the second impedance or vice versa (e.g., by output impedance controller 54). The control circuit may also be configured to, contemporaneously with transitioning the output impedance, transition the variable digital gain continuously or in a series of steps such that an overall path gain of the signal path remains substantially constant during the transitioning of the output impedance (e.g., by digital gain controller 56).

Figure 4A:
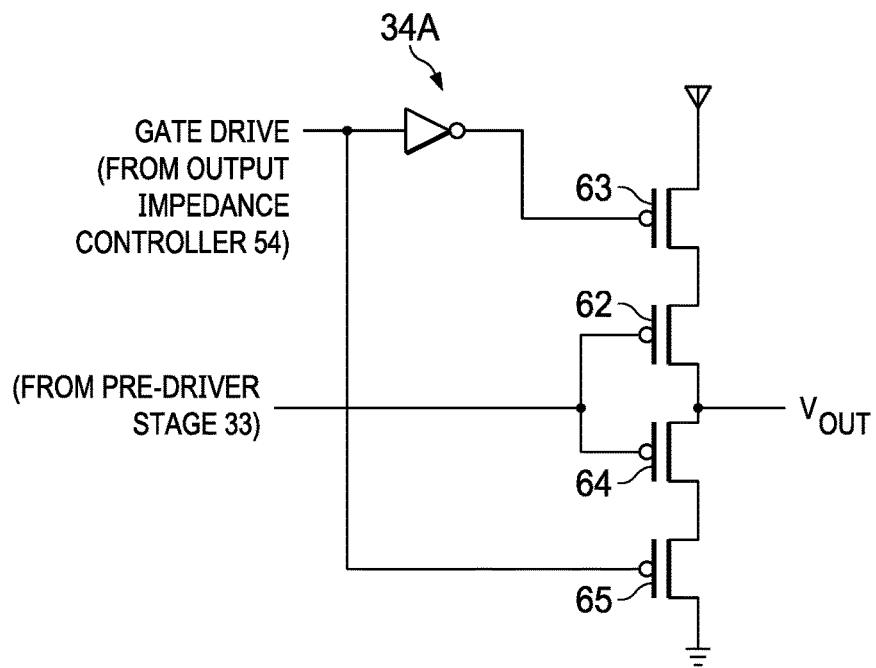
FIG. 4A is a circuit diagram of selected components of an example driver stage, in accordance with embodiments of the present disclosure.
Figure 4B:
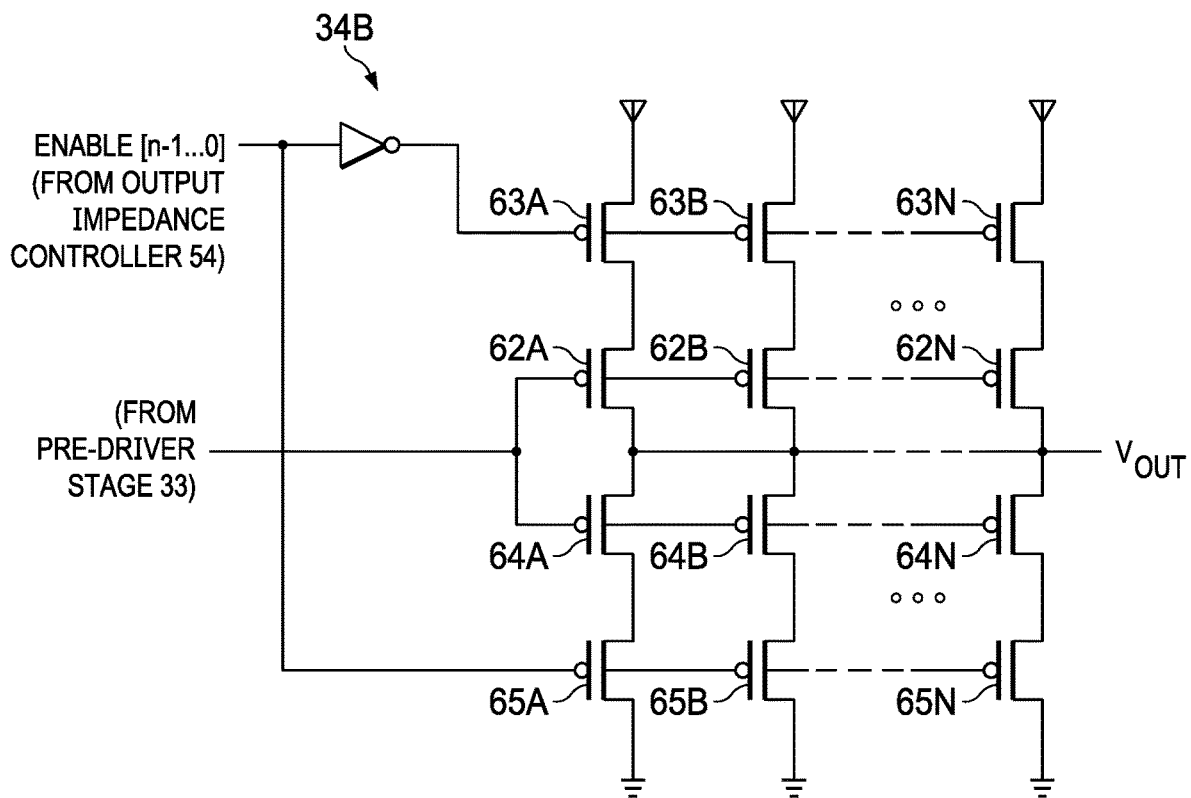
FIG. 4B is a circuit diagram of selected components of another example driver stage, in accordance with embodiments of the present disclosure.

In some embodiments, output impedance controller 54 may be configured to control variable output impedance 48 by varying impedances of driver switches of a driver integral to the analog path portion (e.g., within driver stage 34) as shown in FIGS. 4A and 4B and described below.

FIG. 4A is a circuit diagram of selected components of an example driver stage 34A, in accordance with embodiments of the present disclosure. In some embodiments, driver stage 34 and variable output resistance 48 of FIG. 3 may be implemented by example driver stage 34A. In example driver stage 34A of FIG. 4A, a separate physical variable impedance element may not be required to implement variable output impedance 48, and instead, output impedance controller 54 of control subsystem 30 may be configured to generate control signals to vary a gate drive of driver switches of driver stage 34A in order to implement such variable impedance. As shown in FIG. 4A, example driver stage 34A may be implemented by a high-side driver switch 62 and a low-side driver switch 64 that may each be driven by the pre-driver output signal generated by pre-driver stage 33. A variable drive high-side driver switch 63 may be in series with high-side driver switch 62 and a variable drive low-side driver switch 65 may be in series with low-side driver switch 64 as shown in FIG. 4A. Variable drive high-side driver switch 63 and variable drive low-side driver switch 65 may each receive a gate drive control signal from output impedance controller 54 which may vary the drain-to-source resistances of variable drive high-side driver switch 63 and variable drive low-side driver switch 65, effectively creating a variable output impedance for example driver stage 34A.

FIG. 4B is a circuit diagram of selected components of an example driver stage 34B, in accordance with embodiments of the present disclosure. In some embodiments, driver stage 34 and variable output resistance 48 of FIG. 3 may be implemented by example driver stage 34B. In example driver stage 34B of FIG. 4B, each driver switch may comprise a plurality of switching elements. For example, a high-side driver switch may be implemented with switching elements 62A through 62n driven by the pre-driver output signal generated by pre-driver stage 33, and each switching element 62A through 62n may be in series with a respective enabling switch 63A through 63n wherein each respective enabling switch 63A through 63n may be controlled by a respective ENABLE control signal generated by output impedance controller 54 as shown in FIG. 4B. Similarly, a low-side driver switch may be implemented with switching elements 64A through 64n driven by the pre-driver output signal generated by pre-driver stage 33, and each switching element 64A through 64n may be in series with a respective enabling switch 65A through 65n, wherein each respective enabling switch 65A through 65n may be controlled by a respective ENABLE control signal generated by output impedance controller 54 as shown in FIG. 4B. Accordingly, output impedance controller 54 may effectively create a variable output impedance for example driver stage 34B by selectively enabling and disabling appropriate numbers of switching elements 62A through 62n and switching elements 64A through 64n.

In other embodiments, variable output impedance 48 may comprise one or more components separate from driver stage 34, with examples of variable output impedance 48 shown in FIGS. 5A and 5B and described below.

Figure 5A:
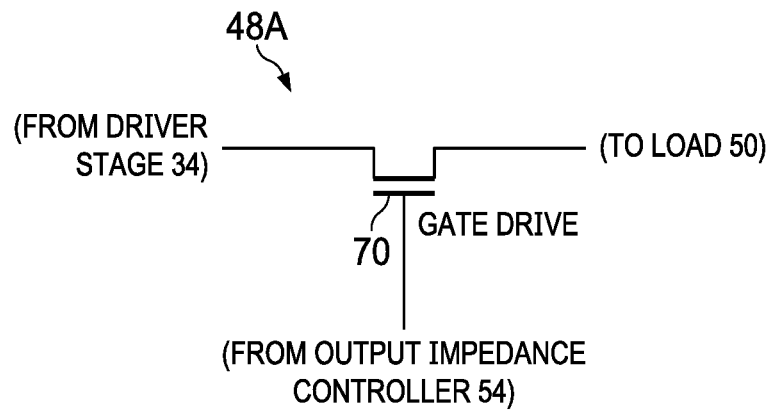
FIG. 5A is a circuit diagram of selected components of an example variable output impedance, in accordance with embodiments of the present disclosure.

FIG. 5A is a circuit diagram of selected components of an example variable output impedance 48A, in accordance with embodiments of the present disclosure. In some embodiments, variable output resistance 48 of FIG. 3 may be implemented by example variable output impedance 48A. As shown in FIG. 5A, output impedance 48A may be implemented with an active metal-oxide-semiconductor resistor 70 (e.g., comprising an n-type metal-oxide-semiconductor field-effect transistor) which, in operation, may be placed in series with an output load (e.g., load 50) of a signal path of PWM amplifier 22. Output impedance controller 54 may be configured to control a drain-to-source impedance of active metal-oxide-semiconductor resistor 70 by varying a gate drive applied to a gate terminal of active metal-oxide-semiconductor resistor 70, effectively creating a variable output impedance.

Figure 5B:
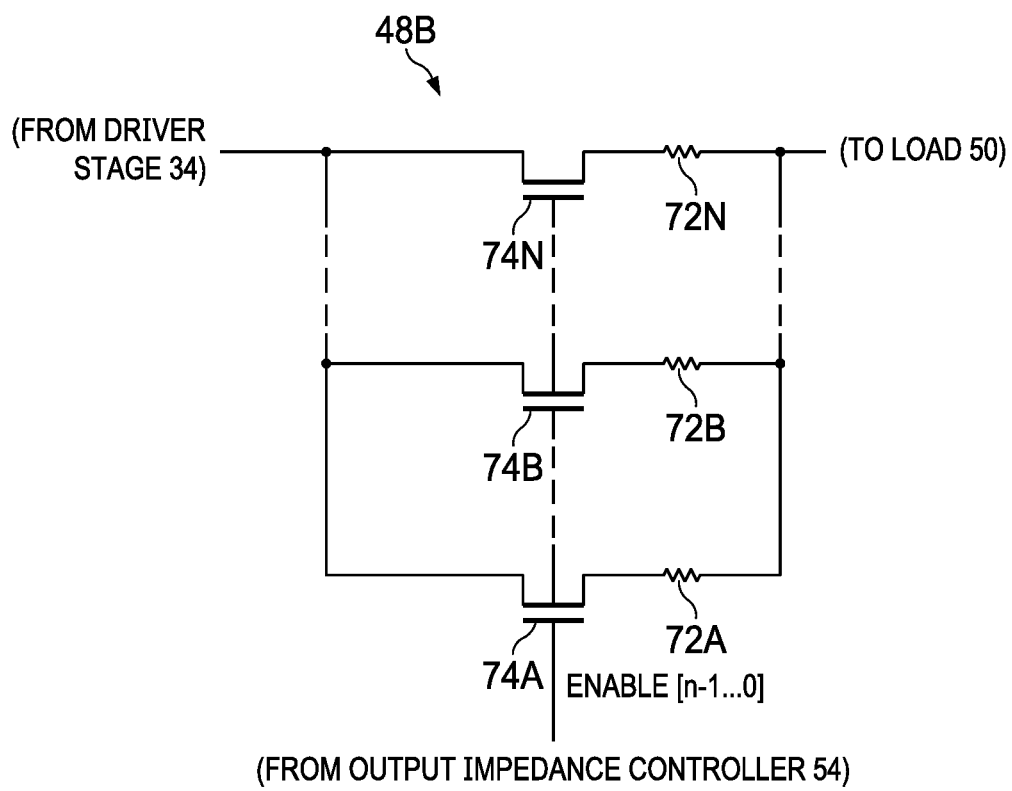
FIG. 5B is a circuit diagram of selected components of another example variable output impedance, in accordance with embodiments of the present disclosure.

FIG. 5B is a circuit diagram of selected components of an example variable output impedance 48B, in accordance with embodiments of the present disclosure. In some embodiments, variable output resistance 48 of FIG. 3 may be implemented by example variable output impedance 48B. As shown in FIG. 5B, output impedance 48B may be implemented by a passive resistor comprising a plurality of switchable resistive elements 72A through 72N, with each switchable resistive element 72A through 72N in series with a respective enabling switch 74A through 74N, wherein each respective enabling switch 74A through 74N may be controlled by a respective ENABLE control signal generated by output impedance controller 54 as shown in FIGURE. Accordingly, output impedance controller 54 may effectively vary an impedance of example variable output impedance 48B by selectively enabling and disabling appropriate numbers of switching elements 74A through 74N.

For purposes of clarity of exposition, load 50 is shown as a single-ended load with output voltage $V_{OUT}$ being a single-ended voltage. However, in some embodiments, PWM amplifier 22 may be implemented with a differential voltage output, such that one driver stage 34 drives a first terminal of load 50 and another driver stage 34 drives a second terminal of load 50.

Although the foregoing contemplates use of PWM amplifier 22 for use in an audio amplifier for driving an audio transducer, it is understood that PWM amplifier 22 may be used in other types of amplifiers for driving other types of transducers, including without limitation an amplifier for driving a haptic transducer.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An apparatus, comprising:
  a signal path comprising:
    an analog signal path portion having an input for receiving an analog signal and an output for providing an output signal, and configured to generate the output signal, wherein the analog signal path portion is configured to operate in a plurality of output impedance modes including a high impedance mode in which an output impedance of the analog signal path portion at the output has a first impedance and a low impedance mode in which the output impedance has a second impedance significantly smaller than the first impedance; and
    a digital path portion having a variable digital gain and configured to receive a digital input signal and convert the digital input signal into the analog signal in conformity with the variable digital gain; and
  a control circuit configured to, responsive to a condition for switching between the high impedance mode and the low impedance mode or vice versa:
    transition the output impedance continuously or in a series of steps between the first impedance and the second impedance or vice versa; and
    contemporaneously with transitioning the output impedance, transition the variable digital gain continuously or in a series of steps such that an overall path gain of the signal path remains substantially constant during the transitioning of the output impedance.

2. The apparatus of claim 1, further comprising a calibration circuit configured to calibrate an analog gain of the analog signal path portion and the variable digital gain during one of the following:
  at product test of the apparatus prior to end use of the apparatus; and
  during real-time operation of the apparatus during end use, wherein the calibration circuit comprises a calibration loop located on an integrated circuit including the signal path.

3. The apparatus of claim 2, wherein during real-time operation of the apparatus during end use, the calibration circuit is configured to calibrate the analog gain and the variable digital gain to compensate for variation of the output impedance due to temperature.

4. The apparatus of claim 1, wherein the control circuit is further configured to, as the output impedance is transitioned continuously or in the series of steps, compensate for phase variations caused by the transitioning of the output impedance.

5. The apparatus of claim 4, further comprising a calibration circuit configured to calibrate a frequency response of the signal path by monitoring the frequency response during one of the following:
  at product test of the apparatus prior to end use of the apparatus; and
  during real-time operation of the apparatus during end use, wherein the calibration circuit comprises a calibration loop located on an integrated circuit including the signal path.

6. The apparatus of claim 4, wherein the digital path portion further comprises a digital pre-compensation filter and the control circuit is configured to compensate for phase variations caused by the transitioning of the output impedance by controlling a frequency response of the digital pre-compensation filter.

7. The apparatus of claim 1, wherein the control circuit is configured to transition the output impedance by varying impedances of driver switches of a driver integral to the analog signal path portion.

8. The apparatus of claim 7, wherein:
  the driver comprises a plurality of driver switches, each driver switch comprising a plurality of switching elements; and
  the control circuit is configured to transition the output impedance by selectively enabling and disabling a number of active switching elements for each driver switch.

9. The apparatus of claim 7, wherein:
the driver comprises a plurality of driver switches; and
the control circuit is configured to transition the output impedance by varying a gate drive of each of the driver switches.

10. The apparatus of claim 1, wherein the output impedance comprises a passive resistor in series with an output load of the signal path wherein the passive resistor comprises a plurality of switchable resistive elements that are selectively enabled and disabled by the control circuit to control the output impedance.

11. The apparatus of claim 1, wherein the output impedance comprises an active metal-oxide-semiconductor resistor in series with an output load of the signal path and the control circuit is configured to control the output impedance by varying a gate drive of the active metal-oxide-semiconductor resistor.

12. A method comprising, in a signal path comprising an analog signal path portion having an input for receiving an analog signal and an output for providing an output signal, and configured to generate the output signal, wherein the analog signal path portion is configured to operate in a plurality of output impedance modes including a high impedance mode in which an output impedance of the analog signal path portion at the output has a first impedance and a low impedance mode in which the output impedance has a second impedance significantly smaller than the first impedance, and a digital path portion having a variable digital gain and configured to receive a digital input signal and convert the digital input signal into the analog signal in conformity with the variable digital gain:
responsive to a condition for switching between the high impedance mode and the low impedance mode or vice versa:
transitioning the output impedance continuously or in a series of steps between the first impedance and the second impedance or vice versa; and
contemporaneously with transitioning the output impedance, transitioning the variable digital gain continuously or in a series of steps such that an overall path gain of the signal path remains substantially constant during the transitioning of the output impedance.

13. The method of claim 12, further comprising calibrating an analog gain of the analog signal path portion and the variable digital gain during one of the following:
at product test of an apparatus comprising the signal path prior to end use of the apparatus; and
during real-time operation of the apparatus during end use, wherein the calibration is performed with calibration loop located on an integrated circuit including the signal path.

14. The method of claim 13, wherein during real-time operation of the apparatus during end use, calibrating the analog gain and the variable digital gain compensates for variation of the output impedance due to temperature.

15. The method of claim 12, further comprising, as the output impedance is transitioned continuously or in the series of steps, compensating for phase variations caused by the transitioning of the output impedance.

16. The method of claim 15, further comprising calibrating a frequency response of the signal path by monitoring the frequency response during one of the following:
at product test of an apparatus comprising the signal path prior to end use of the apparatus; and
during real-time operation of the apparatus during end use, wherein the calibration is performed with calibration loop located on an integrated circuit including the signal path.

17. The method of claim 15, further comprising compensating for phase variations caused by the transitioning of the output impedance by controlling a frequency response of a digital pre-compensation filter.

18. The method of claim 12, further comprising transitioning the output impedance by varying impedances of driver switches of a driver integral to the analog signal path portion.

19. The method of claim 18, wherein:
the driver comprises a plurality of driver switches, each driver switch comprising a plurality of switching elements; and
the method further comprises transitioning the output impedance by selectively enabling and disabling a number of active switching elements for each driver switch.

20. The method of claim 19, wherein:
the driver comprises a plurality of driver switches; and
the method further comprises transitioning the output impedance by varying a gate drive of each of the driver switches.

21. The method of claim 12, wherein:
the output impedance comprises a passive resistor in series with an output load of the signal path wherein the passive resistor comprises a plurality of switchable resistive elements; and
the method further comprises selectively enabling and disabling the plurality of switchable resistive elements to control the output impedance.

22. The method of claim 12, wherein:
the output impedance comprises an active metal-oxide-semiconductor resistor in series with an output load of the signal path; and
the method further comprises controlling the output impedance by varying a gate drive of the active metal-oxide-semiconductor resistor.

* * * * *